(12) United States Patent
Miyake et al.

(10) Patent No.: US 7,723,692 B2
(45) Date of Patent: May 25, 2010

(54) SOLID STATE RADIATION SENSOR AND MANUFACTURING METHOD OF THE SAME

(75) Inventors: Kiyoteru Miyake, Kanagawa-ken (JP);
Toshiyuki Nabeta, Kanagawa-ken (JP);
Kenji Takahashi, Kanagawa-ken (JP);
Kaku Irisawa, Kanagawa-ken (JP);
Shinji Imai, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 644 days.

(21) Appl. No.: 11/602,345

(22) Filed: Nov. 21, 2006

(65) Prior Publication Data
US 2007/0125953 A1 Jun. 7, 2007

(30) Foreign Application Priority Data
Nov. 21, 2005 (JP) ............................. 2005-336337
Jul. 27, 2006 (JP) ............................. 2006-204293

(51) Int. Cl.
G01T 1/24 (2006.01)
(52) U.S. Cl. ................................................. 250/370.01
(58) Field of Classification Search ............. 250/370.01
See application file for complete search history.

(56) References Cited

U.S. PATENT DOCUMENTS

| 3,685,989 A | 8/1972 | Galen |
| 5,396,072 A | 3/1995 | Schiebel et al. |
| 6,171,643 B1 * | 1/2001 | Polischuk et al. ............. 427/76 |
| 2003/0223534 A1 | 12/2003 | Sato et al. |
| 2005/0061987 A1 * | 3/2005 | Watadani et al. ....... 250/370.08 |

FOREIGN PATENT DOCUMENTS

| CA | 2184667 | 3/1998 |
| JP | 2001-244492 A | 9/2001 |

* cited by examiner

Primary Examiner—Constantine Hannaher
(74) Attorney, Agent, or Firm—Sughrue Mion, PLLC

(57) ABSTRACT

A solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals. Here, a predetermined region is provided between the electrodes, and the average density of an alkali metal in the predetermined region is greater than or equal to 10 times the average density of the alkali metal in the area between the electrodes other than the predetermined region.

17 Claims, 5 Drawing Sheets

SOLID STATE RADIATION SENSOR AND MANUFACTURING METHOD OF THE SAME

BACKGROUND OF THE INVENTION

1. Field of the Invention

The present invention relates to a solid state radiation sensor, suitable for use with an imaging apparatus using radiation, such as X-rays or the like, and a manufacturing method of the sensor.

2. Description of the Related Art

In the field of medical X-ray imaging, X-ray imaging panels (solid state radiation sensors) are known. The X-ray imaging panel uses an X-ray sensitive photoconductive layer as a photoconductor, in order to improve diagnostic capabilities with a reduced amount of radiation received by a subject, and an electrostatic latent image formed by the X-rays on the photoconductive layer is read out by light or multitudes of electrodes and recorded. The method described above is superior to the known image projection method called indirect imaging using TV camera tube, in that it may obtain higher resolution.

The X-ray imaging panel described above includes therein a charge generation layer that receives X-rays and generates charges corresponding to the received X-ray energies, and the generated charges are read out as electrical signals. The photoconductive layer described above functions as the charge generation layer. Generally, materials such as amorphous selenium (a-Se), PbO, $PbI_2$, $HgI_2$, $BiI_3$, Cd(Zn)Te, and the like are used for the photoconductive layer.

The use of amorphous selenium may readily provide large surface area through a thin film forming technique such as vacuum deposition method and the like, but the resultant photoconductive layer have many structural defects because of its amorphous nature, so that the sensitivity of the photoconductive layer is likely to be degraded. Consequently, it is customary that an appropriate amount of impurity is doped in the amorphous selenium in order to improve the performance. For example, U.S. Patent Application Publication No. 20030223534 describes a recording photoconductive layer formed of amorphous selenium doped with an alkali metal of 0.01 to 10 ppm. Japanese Unexamined Patent Publication No. 2001-244492 describes a recording photoconductive layer formed of amorphous selenium doped with Na of 70 ppm as the alkali metal. Further, U.S. Pat. No. 3,685,989 describes a recording photoconductive layer formed of amorphous selenium doped with Na of 100 ppm.

Further, U.S. Pat. No. 5,396,072 describes an X-ray image detector that includes a semiconductor layer with a thickness in the range from 0.5 to 2 µm formed of selenium doped with an alkali metal of 20 to 200 ppm that conducts electrons without conducting holes. Still further, the Canadian Patent No. 2184667 describes an X-ray image multilayer plate that includes a semiconductor layer having unipolar buffer layers, each with a thickness of 0.5 and 10 µm formed of selenium doped with an alkali metal.

As a result of committed study, the inventors of the present invention have found that the electron mobility is improved if a predetermined region between electrodes of the solid state radiation sensor has a higher alkali metal density than the other region. The amorphous selenium doped with an alkali metal like that described in U.S. Patent Application Publication No. 20030223534 may cause local crystallization, and the use of such amorphous selenium for the photoconductive layer may cause an image defect with time.

The present invention has been developed in view of the circumstances described above, and it is an object of the present invention to provide a solid state radiation sensor that includes a recording photoconductive layer having a predetermined density distribution of a doped alkali metal, less structural defects, and high electron mobility, and a manufacturing method of the solid state radiation sensor.

SUMMARY OF THE INVENTION

The first solid state radiation sensor of the present invention is a solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals. Here a predetermined region is provided between the electrodes, and the average density of an alkali metal in the predetermined region is greater than or equal to 10 times the average density thereof in the area between the electrodes other than the predetermined region.

Preferably, the average density of the alkali metal in the predetermined region is greater than or equal to 100 times the average density thereof in the area between the electrodes other than the predetermined region.

Preferably, the predetermined region extends not greater than 1000 µm from either of the interfaces of the recording photoconductive layer in the thickness direction within either the recording photoconductive layer or the electrode. More preferably, the predetermined region extends not greater than 20 µm from either of the interfaces of the recording photoconductive layer in the thickness direction within the recording photoconductive layer. Preferably, the thickness of the predetermined region is from 5 to 100 nm. More preferably, the average alkali metal density in the predetermined region is 0.2 to 10 ppm.

Preferably, the recording photoconductive layer is formed of amorphous selenium.

The second solid state radiation sensor of the present invention is a solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals. Here, the recording photoconductive layer is formed of amorphous selenium doped with a predetermined amount of an alkali metal, the average density of the alkali metal in the recording photoconductive layer is not greater than 10 ppm, and the electron lifetime of the recording photoconductive layer is greater than or equal to 500 µs.

The third solid state radiation sensor of the present invention is a solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals. Here, the recording photoconductive layer is formed of amorphous selenium doped with a predetermined amount of an alkali metal; and the average density of the alkali metal in the recording photoconductive layer is not greater than $\frac{1}{100}$ of the alkali metal density of the material of the recording photoconductive layer.

Preferably, in the recording photoconductive layer of the solid state radiation sensors of the present invention, the alkali material is Na.

The solid state radiation sensors of the present invention may be produced by obtaining the recording photoconductive layer through deposition of the amorphous selenium not containing any alkali metal in an evaporator modified by a compound containing the alkali metal.

The first solid state radiation sensor of the present invention is a solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals. Here, a predetermined region is provided between the electrodes, and the average density of an alkali metal in the predetermined region is greater than or equal to 10 times the average density thereof in the area between the electrodes other than the predetermined region, so that the first solid state radiation sensor of the present invention has less sensitivity degradation, longer electron lifetime, and superior electron mobility. Further, the solid state radiation sensor of the present invention may not impair the hole mobility characteristics.

In particular, the solid state radiation sensor of the present invention having the region with a thickness of 5 to 100 nm, and an average alkali metal density of 0.2 to 10 ppm is more preferable, since such solid state radiation sensor may provide both improved electron mobility and minimized crystallization due to the doped alkali metal.

The second solid state radiation sensor of the present invention is a solid state radiation sensor, in which the recording photoconductive layer is formed of amorphous selenium doped with a predetermined amount of an alkali metal, the average density of the alkali metal in the recording photoconductive layer is not greater than 10 ppm, and the electron lifetime thereof is greater than or equal to 500 µs, so that the second solid state radiation sensor of the present invention has superior electron mobility and high sensitivity, allowing a large amount of charges to be collected.

The third solid state radiation sensor of the present invention is a solid state radiation sensor, in which the recording photoconductive layer is formed of amorphous selenium doped with a predetermined amount of an alkali metal; and the average density of the alkali metal in the recording photoconductive layer is not greater than 1/100 of the alkali metal density of the material of the recording photoconductive layer, so that less carrier traps and hence less structural defects are created, resulting in the third solid state radiation sensor of the present invention to have superior electron mobility.

DESCRIPTION OF THE PREFERRED EMBODIMENTS

The solid state radiation sensor of the present invention is a solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals. Here, a predetermined region is provided between the electrodes, and the average density of an alkali metal in the predetermined region is greater than or equal to 10 times the average density thereof in the area between the electrodes other than the predetermined region.

There are two types of solid state radiation sensors: a direct conversion system, in which the radiation is converted to charges directly by the photoconductive layer and accumulated; and an indirect conversion system, in which the radiation is converted first to light by a scintillator formed of CsI:Tl GOS ($Gd_2O_2S$:Tb) or the like, and then converted to charges by the photoconductive layer and accumulated. The solid state radiation sensor of the present invention may be applied to the former, direct conversion system, or the latter, indirect conversion system photoelectrical conversion layer, as long as amorphous selenium is used as the photoconductive layer. Further, the solid state radiation sensor may use γ-rays, α-rays, as well as X-ray, as the radiation.

Further, the solid state radiation sensor of the present invention may be applied to a so-called optical readout system, in which charges are read out by a radiation image detector employing a semiconductor material that generates charges by receiving light, or another readout system, in which charges generated by the irradiation of radiation are accumulated, and the accumulated charges are read out by switching ON and OFF electrical switches, such as thin film transistors (TFTs) or the like, on a pixel-by-pixel basis (hereinafter, TFT system).

Figure 1:
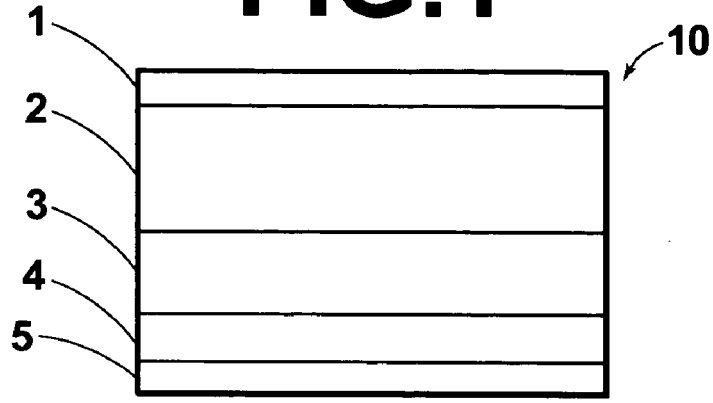
FIG. 1 is a cross-sectional view of the solid state radiation sensor according to an embodiment of the present invention.

First, description will be made of a solid state radiation sensor used in the former, optical readout system, as an example. FIG. 1 is a cross-sectional view of the solid state radiation sensor according to an embodiment of the present invention.

The solid state radiation sensor 10 includes the following layers layered in the order listed below: a first conductive layer 1 that transmits recording radiation L1, described later; a recording photoconductive layer 2 that shows conductivity by receiving the recording radiation L1 transmitted through the first conductive layer 1; a charge transport layer 3 that acts as substantially an insulator against the charges charged on the first conductive layer 1 (latent image polarity charges, for example, negative charges) and substantially as a conductor for charges having the other polarity of the latent image polarity charges; a readout photoconductive layer 4 that shows conductivity by receiving readout light L2, described later; and a second conductive layer 5 that transmits the readout light L2. FIG. 1 illustrates an embodiment in which that the charge transport layer is provided between the recording photoconductive layer 2 and readout photoconductive layer 4. Alternatively, the charge transport layer may be disposed between the conductive layer 1 and recording photoconductive layer 2. Further, it may be provided at both places, i.e., two charge transport layers may be provided.

The predetermined region in the solid state radiation sensor shown in FIG. 1 is provided between the conductive layer 1 and conductive layer 5. Preferably, the predetermined region extends in the thickness direction of the recording photoconductive layer 2 not greater than 1000 µm from the interface between the recording photoconductive layer 2 and conductive layer 1, or extends in the thickness direction of the recording photoconductive layer 2 not greater than 1000 μm from the interface between the recording photoconductive layer 2 and charge transport layer 3, otherwise extends to the side of the charge transport layer 3 from the interface between the charge transport layer 3 and recording photoconductive layer 2. The same is true in the case where the charge transport layer 3 is disposed between the conductive layer 1 and recording photoconductive layer 2.

If the predetermined region is to be provided in the recording photoconductive layer, it may be provided by the following manner. When forming a recording photoconductive layer using amorphous selenium having a predetermined average density of doped alkali metal, the density of the alkali metal in the material of the photoconductive layer is increased by greater than or equal to 10 times the predetermined average density, and the alkali material is reacted with the amorphous selenium in advance to provide a selenium alloy, which is then put into a crucible for vapor deposition.

The predetermined region may also be provided in the recording photoconductive layer by depositing a-Se that does not contain any alkali metal in an evaporator (including the crucible) modified by a compound containing an alkali metal. Here, the referent of "modified by a compound containing an alkali metal" means that alkali metal remain in the evaporator (including the crucible) after vapor deposition is performed using a compound containing the alkali metal.

As for the compound containing an alkali metal, selenium doped with an alkali metal; an alkali halide, such as NaCl, LiF, RbBr, or NaF; or an alkali metal chalcogenide, such as $Na_2S$, $Na_2Se$, or $Na_2Te$ may be used. Further, the crucible may be dipped in an alkali hydroxide solution, such as NaOH, or LiOH.

In a solid state radiation sensor having a predetermined region formed in the manner as described above, the average density of the alkali metal in the predetermined region is greater than or equal to 10 times the average density thereof in the area between the electrodes other than the predetermined region, so that the electron lifetime of the solid state radiation sensor may be extended.

Preferably, each of the conductive layers 1 and 5 includes, for example, a transparent glass on which a conductive material is applied uniformly (NESA film or the like). More specifically, a thin film of polycrystalline ITO ($In_2O_3$:Sn), amorphous ITO ($In_2O_3$:Sn), amorphous IZO ($In_2O_3$:Zn), ATO ($SnO_2$:Sb), FTO ($SnO_2$:F), AZO (ZnO:Al), GZO (ZnO:Ga), gold, silver, platinum, aluminum, indium, or the like, a coated film of a solution in which pieces of a precious metal (platinum, gold, or silver), of a size from approximately 10 to 1000 nm are dispersed, or the like is preferable.

As for the material of the charge transport layer 3, for example, a material having a greater difference in charge mobility between the negative charges charged on the first conductive layer 1 and the charges having opposite polarity of positive polarity is preferably used. In this respect, organic compounds, such as polyN-vinylcarbazole (PVK), N,N'-diphenyl-N,N'-bis (3-methylphenyl)-[1,1'-biphenyl]-4,4'-diamine(TPD), discotic liquid crystal, and the like, or semiconductor materials such as TPD-dispersed polymers (polycarbonate, polystyrene, PVK, polyvinyl alcohol), $As_2Se_3$, $Sb_2S_3$, silicon oil, a-Se doped with 10 to 200 ppm of Cl, and the like, and polycarbonate are preferably used. In particular, the organic compounds (PVK, TPD, discotic liquid crystal) are preferable, since they are insensitive to light. Further, they have a small dielectric constant in general so that the capacitance between the charge transport layer 3 and readout photoconductive layer 4 is also small, thereby the signal extraction efficiency at the time of signal reading may be enhanced.

As for the material of the readout photoconductive layer 4 a photoconductive material that consists mainly of at least one of the materials selected from the group of a-Se, a-Se doped with 10 to 200 ppm of Cl, Se doped with 5 to 200 ppm of a V-family element, such as As, Se—Te, Se—As—Te, $As_2Se_3$, nonmetal phthalocyanine, metal phthalocyanine, MgPc (Magnesium phthalocyanine), VoPc (phase II of Vanadyl phthalocyanine), CuPc (Copper phthalocyanine), $Bi_{12}MO_{20}$ (M: Ti, Si, Ge), $Bi_4M_3O_{12}$(M: Ti, Si, Ge), $Bi_2O_3$, $BiMO_4$(M: Nb, Ta, V), $Bi_2WO_6$, $Bi_{24}B_2O_{39}$, ZnO, ZnS, ZnSe, ZnTe, $MNbO_3$(M: Li, Na, K), PbO, $HgI_2$, $PbI_2$, CdS, CdSe, CdTe, $BiI_3$, and the like is preferably used. Preferably, the thickness of the readout photoconductive layer 4 is approximately 0.1 μm to 1.0 μm. Further, a selenium alloy doped with 0.3 to 100 ppm of a monovalent metal and 0.1 to 4000 ppm of a V-family element may be preferably used.

An electron injection blocking layer may be provided between the first conductive layer 1 and recording photoconductive layer 2. As for the material of the electron injection blocking layer, antimony sulfide, or N,N'-diphenyl-N,N'-bis (3-methylphenyl)-[1,1'-biphenyl]-4,4'-diamine(TPD) is used. Further, a hole injection blocking layer may be provided between the readout photoconductive layer 4 and second conductive layer 5. As for the material of the hole injection blocking layer, cerium oxide, antimony sulfide, or zinc sulfide is used.

Figure 2:
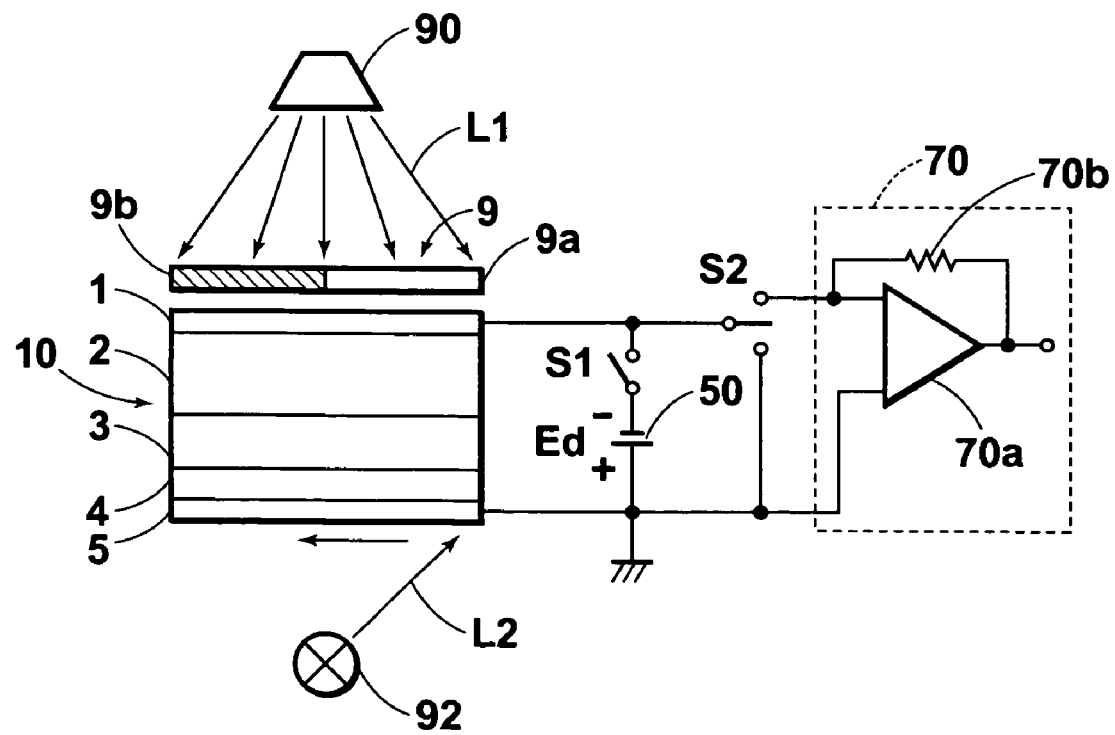
FIG. 2 is a schematic view of a recording/readout system using the solid state radiation sensor.

A method for reading out an electrostatic latent image using light will now be described briefly. FIG. 2 is a schematic view of a recording/readout system (combined system of electrostatic latent image recording apparatus and electrostatic latent image readout apparatus) using a solid state radiation sensor 10. The recording/readout system includes: the solid state radiation sensor 10; a recording irradiation means 90; a power source 50; a current detection means 70; a readout exposure means 92; and connection means S1 and S2. The section corresponding to the electrostatic latent image recording apparatus includes: the solid state radiation sensor 10; power source 50; recording irradiation means 90; and connection means S1. The section corresponding to the electrostatic latent image readout apparatus includes: the solid state radiation sensor 10; current detection section 70; and connection means S2.

The conductive layer 1 of the solid state radiation sensor 10 is connected to the negative terminal of the power source 50 through the connection means S1, and also to the terminal of one end of the connection means S2. One of the terminals of the other end of the connection means S2 is connected to the current detection means 70, and conductive layer 5 of the solid state radiation sensor 10, positive terminal of the power source 50, and the other terminal of the other end of the connection means S2 are grounded. The current detection means 70 includes a detection amplifier 70a formed of an operational amplifier and a feedback resistor 70b, forming a so-called current-voltage conversion circuit.

The conductive layer 5 may also be a conductive layer having a structure as described, for example, in Japanese unexamined Patent Publication Nos. 2001-337171 and 2001-160922.

A subject 9 is placed on the upper surface of the conductive layer 1. The subject 9 includes a portion 9a which is transparent to the radiation L1, and a blocking portion 9b which is not transparent to the radiation L1. The recording irradiation means 90 irradiates the radiation L1 uniformly on the subject 9. The readout exposure means 92 scan exposes readout light L2, such as laser light, LED, organic EL, inorganic EL, or the like, in the arrow direction shown in FIG. 3. Preferably, the readout light L2 has a linearly focused shape.

Figure 3A:
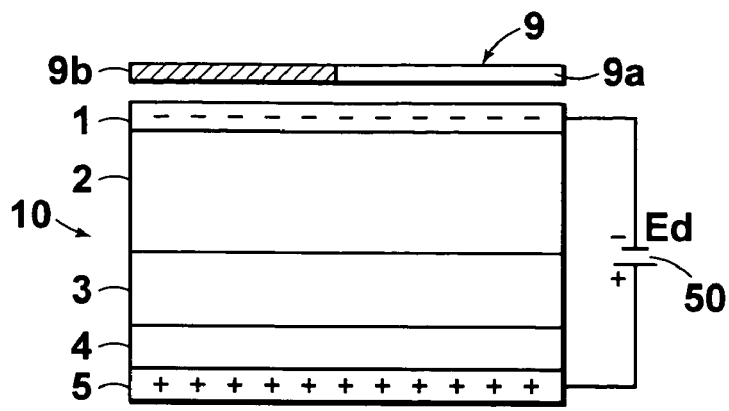
FIGS. 3A to 3D are drawings illustrating a recording process of an electrostatic latent image in the recording/readout system using charge models.

An electrostatic latent image recording process in the recording/readout system constructed in the manner as described above will now be described with reference to charge models. In FIG. 2, the connection means S1 is switched ON, with the connection means S2 being opened (connected neither to the ground nor current detection amplifier 70), to apply a DC voltage Ed from the power source 50 between the conductive layer 1 and conductive layer 5, in which negative charges from the power source 50 are charged on the conductive layer 1, and positive charges from the power source 50 are charged on the conductive layer 5 (FIG. 3A). This causes a parallel electric field to be formed between the conductive layer 1 and conductive layer 5 of the solid state radiation sensor 10.

Figure 3B:
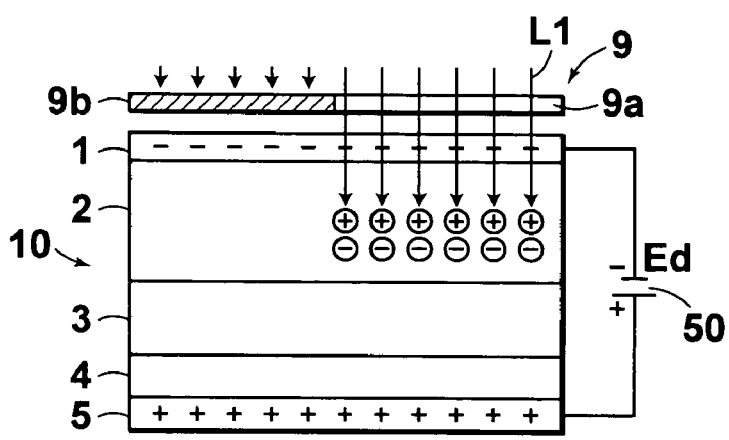

Then, the radiation L1 is irradiated uniformly on the subject 9 from the recording irradiation means 90. The irradiated radiation L1 transmits through the transmission section 9a and further transmits through the conductive layer 1. The photoconductive layer 2 becomes conductive by receiving the transmitted radiation L1. This may be understood that the photoconductive layer 2 acts as a variable resistor that shows variable resistance according to the dose of received radiation L1. The resistance value depends on the amount of charge pairs of electrons (negative charges) and holes (positive charges) generated by the radiation L1, which is great when the dose of radiation transmitted through the subject is small (FIG. 3B). The negative charges (−) and positive charges (+) are indicated by encircled − and encircled + signs respectively in the drawings.

Figure 3C:
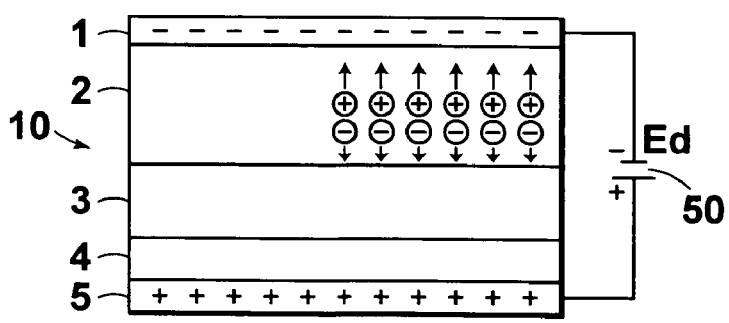
Figure 3D:
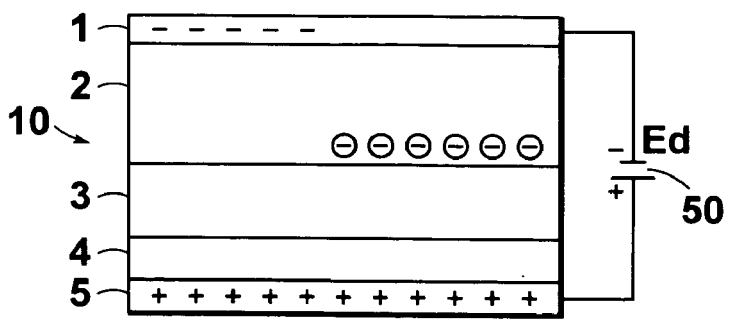

The positive charges generated in the recording photoconductive layer 2 move rapidly toward the conductive layer 1 through the photoconductive layer 2, and recombine with the negative charges charged at the interface between the conductive layer 1 and recording photoconductive layer 2 and disappear (FIGS. 3C and 3D). On the other hand, the negative charges generated in the recording photoconductive layer 2 move toward the charge transport layer 3 through the recording photoconductive layer 2. The charge transport layer 3 acts as an insulator against charges having the same polarity as that of the charges charged on the conductive layer 1 (negative charges in this case), the negative charges moved through the recording photoconductive layer 2 are stopped at the interface between the recording photoconductive layer 2 and charge transport layer 3 and accumulated there (FIGS. 3C and 3D). The amount of accumulated charges depends on the amount of negative charges generated in the recording photoconductive layer 2, i.e., the dose of radiation L1 transmitted through the subject 9.

In the mean time, the radiation L1 does not transmit through the blocking section 9b of the subject 9, the portion of the solid state radiation sensor 10 beneath the blocking section 9b shows no changes at all (FIGS. 3B to 3D). In this way, by irradiating the radiation L1 on the subject 9, charges according to the subject image may be accumulated at the interface between the recording photoconductive layer 2 and charge transport layer 3. Here, the subject image represented by the accumulated charges is referred to as an electrostatic latent image.

Figure 4A:
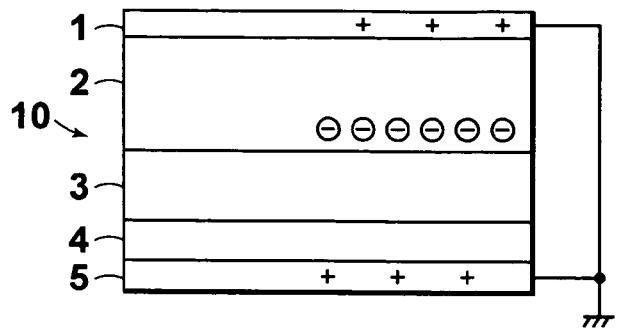
FIGS. 4A to 4D are drawings illustrating a readout process of an electrostatic latent image in the recording/readout system using charge models.

Next, an electrostatic latent image readout process will be described with reference to charge models (FIGS. 4A to 4D). The connection means S1 is opened to terminate the power supply, and the connection means S2 is tentatively connected to the side of ground to induce charge rearrangement by charging the conductive layer 1 and conductive layer 5 of the solid state radiation sensor 10, in which an electrostatic latent image is recorded, at the same potential (FIG. 4A). Thereafter, the connection means S2 is connected to the side of the current detection means 70.

Figure 4B:
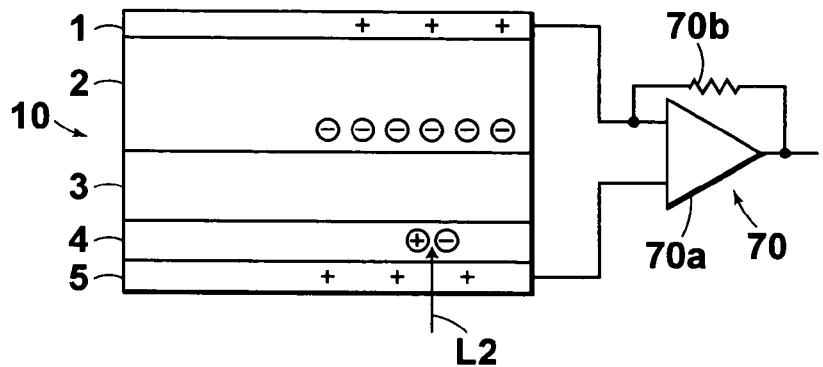

When the readout light L2 is scan exposed on the side of the conductive layer 5 of the solid state radiation sensor 10 by the readout exposure means 92, the readout light L2 transmits through the conductive layer 5. The photoconductive layer 4 that received the transmitted readout light L2 becomes conductive according to the scan exposure. This is because negative/positive charge pairs are generated in the photoconductive layer 4 by receiving the readout light L2, as in the case in which the recording photoconductive layer 2 becomes conductive by generating negative/positive charge pairs therein by receiving the radiation L1 (FIG. 4B). The negative charges (−) and positive charges (+) generated by the readout light L2 are indicated by encircled − and encircled + signs respectively in the drawings as in the recording process.

Figure 4C:
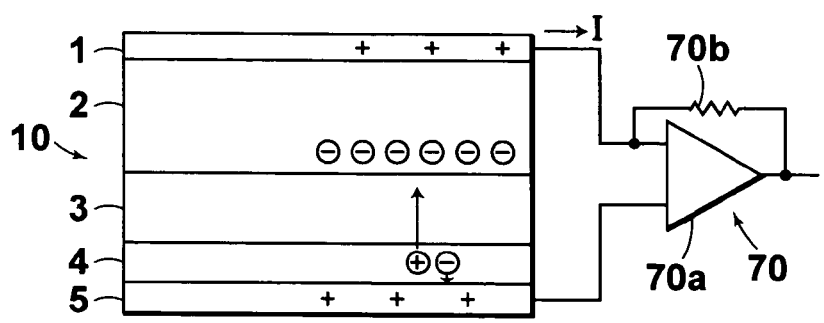
Figure 4D:
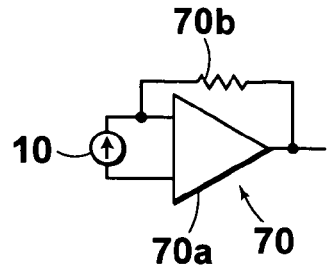

The charge transport layer 3 acts as a conductor for positive charges, so that the positive charges generated in the readout photoconductive layer 4 move rapidly through the charge transport layer 3 attracted by the accumulated charges, and recombine with the accumulated charges at the interface between the recording photoconductive layer 2 and charge transport layer 3 and disappear (FIG. 4C). On the other hand, the negative charges generated in the photoconductive layer 4 recombine with the positive charges charged on the conductive layer 5 and disappear (FIG. 4C). The photoconductive layer 4 is scan exposed by the readout light having sufficient energy to cause all of the charges accumulated at the interface between the recording photoconductive layer 2 and charge transport layer 3, i.e., the electrostatic latent image, to be disappeared. Disappearance of the charges accumulated in the solid state radiation sensor 10 in the manner as described above means that a current I flows through the solid state radiation sensor 10 due to charge mobility. This may be indicated by an equivalent circuit, in which the solid state radiation sensor 10 is represented by a current source whose amount of current depends on the amount of accumulated charges as shown in FIG. 4D.

In this way, by detecting currents flowing out of the solid state radiation sensor 10 while scan exposing the readout light 12, the accumulated charges in each scan exposed section (corresponding to each pixel) may be read out sequentially, thereby the electrostatic latent image may be read out. Operation of the radiation detection section is described in Japanese Unexamined Patent Publication No. 2000-105297.

Figure 5:
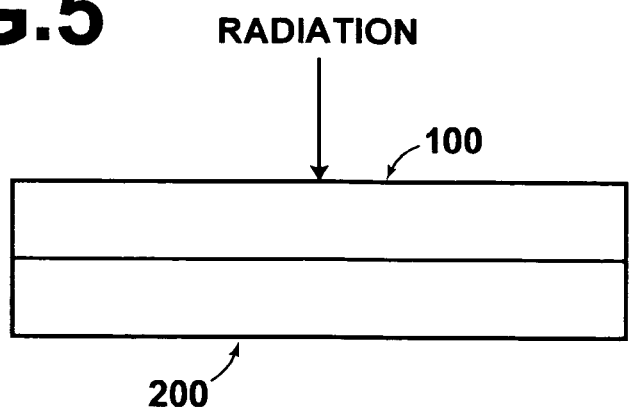
FIG. 5 is a schematic view illustrating the integrated state of the solid state radiation sensor and an AMA substrate.
Figure 6:
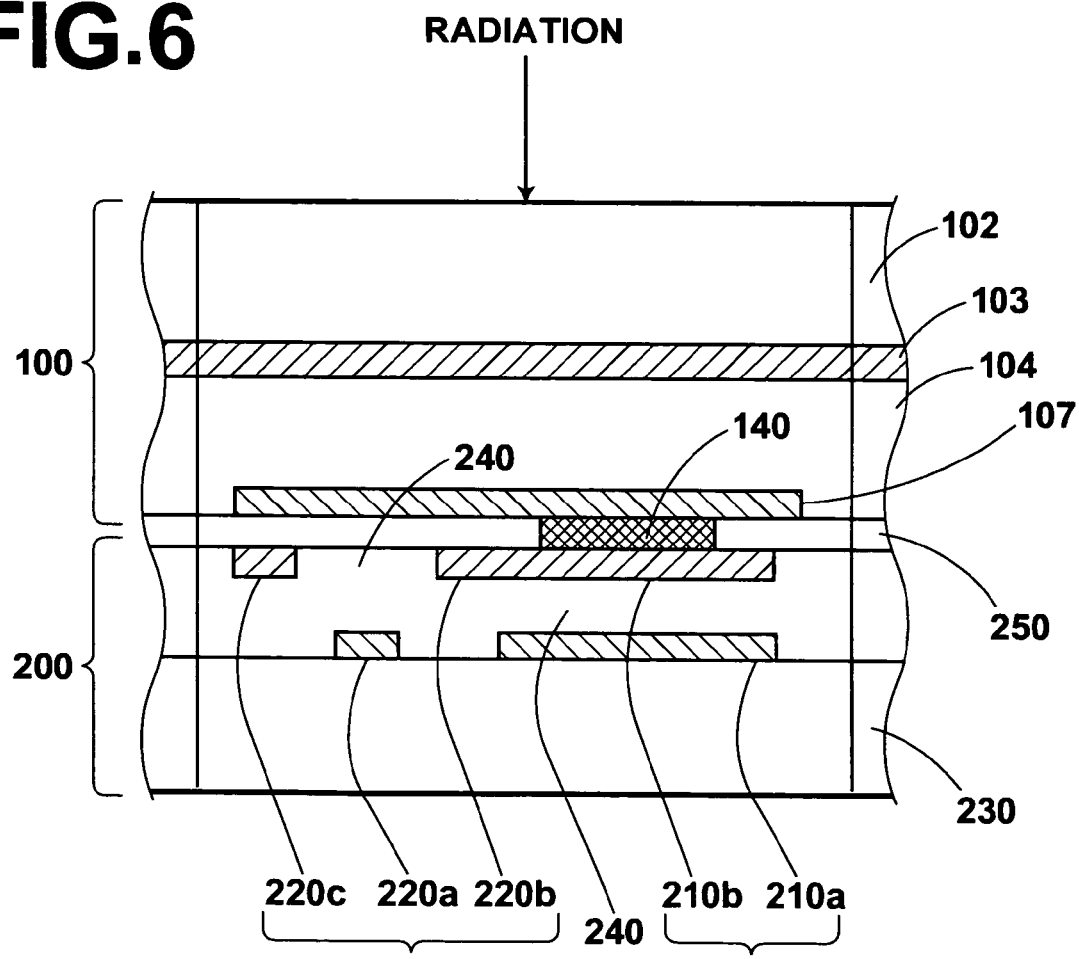
FIG. 6 is a schematic cross-sectional view of a radiation detection section.

Next, a TFT system solid state radiation sensor will be described. This type of solid state radiation sensor includes a radiation detection section 100 and an active matrix array substrate (AMA substrate) combined together as shown in FIG. 5. As shown in FIG. 6, the radiation detection section 100 mainly includes the following layered in the order listed below from the side from which radiation is irradiated: a common electrode 103 for applying a bias voltage; a recording photoconductive layer 104 that generates carriers, electron/hole pairs, in response to the radiation to be detected; and a detection electrode 107 for collecting carriers. A radiation detection section support 102 may be provided on the upper surface of the common electrode 103.

The predetermined region in the solid state radiation sensor shown in FIG. 6 is provided between the common electrode 103 and detection electrode 107 for collecting carriers. Preferably, the predetermined region extends in the thickness direction of the recording photoconductive layer 104 not greater than 1000 μm from the interface between the recording photoconductive layer 104 and common electrode 103.

The common electrode 103 and detection electrode 107 are, for example, formed of a conductive material, such as ITO (Indium Tin Oxide), Au, Pt, or the like. According to the polarity of the bias voltage, a hole injection blocking layer or an electron injection blocking layer may be added to the common electrode 103 and detection electrode 107. As for the material of the hole injection blocking layer, cerium oxide, antimony sulfide, or zinc sulfide is used. As for the material of the electron injection blocking layer, antimony sulfide, or N,N'-diphenyl-N,N'-bis(3-methylphenyl)-[1,1'-biphenyl]-4, 4'-diamine(TPD) is used.

Figure 7:
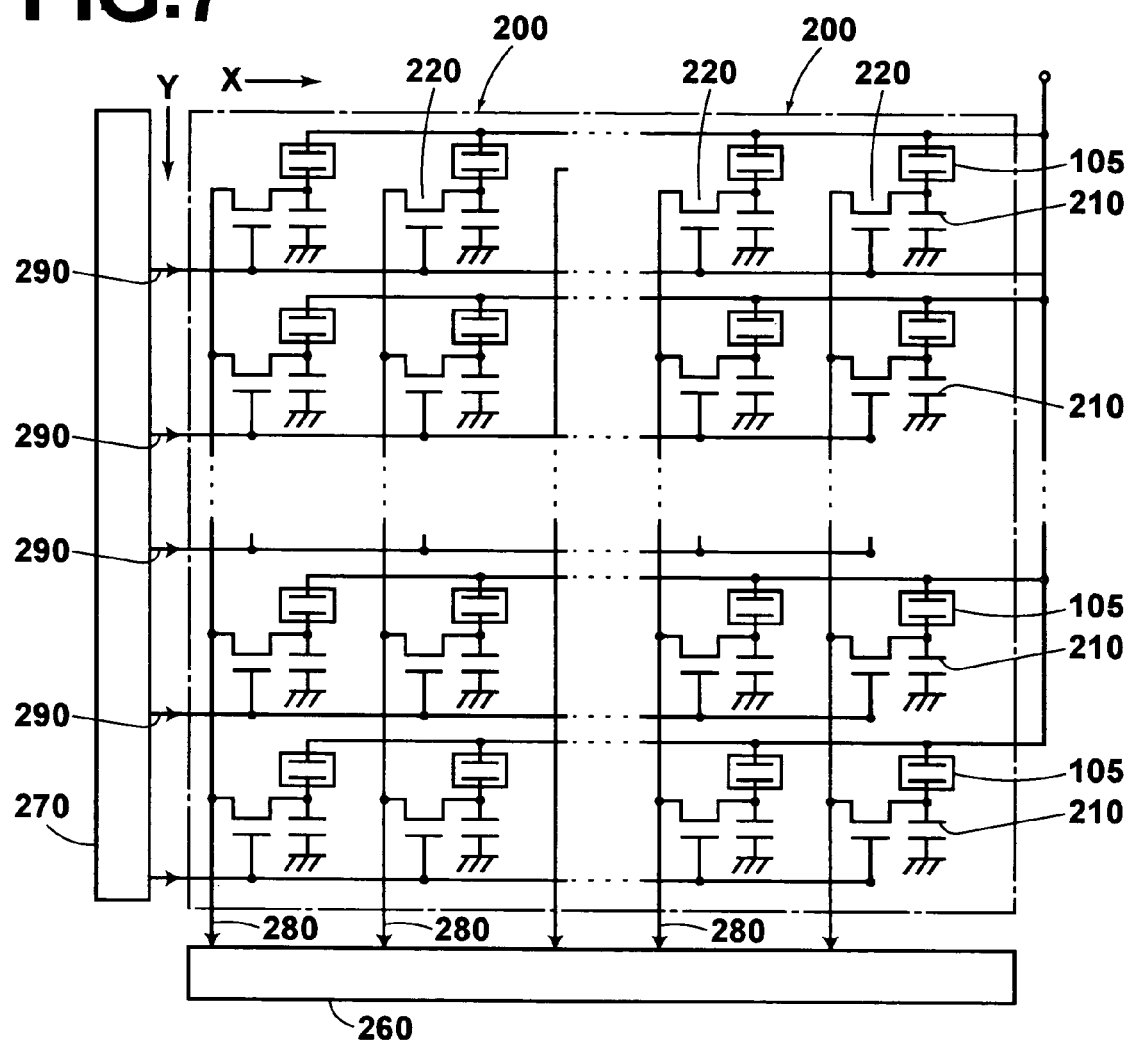
FIG. 7 is an equivalent electrical circuit diagram of the AMA.

Each section of the AMA substrate 200 will now be described briefly. As shown in FIG. 7, a capacitor 210 as charge accumulation capacitor and a TFT 220 as a switching element are provided for each of the radiation detection sections 105 corresponding to the number of pixels. A number of radiation detection sections 105 corresponding to the number of pixels are disposed two-dimensionally on the support 102 in a matrix form with a size of 1000 to 3000×1000 to 3000 according to the required number of pixels. On the AMA substrate 200, a number of capacitors 210 and TFTs 220 corresponding to the number of pixels are also disposed two-dimensionally in the similar matrix form. The charges generated in the recording photoconductive layer are accumulated in the capacitors 210 and formed as an electrostatic latent image according to the type of readout system. In the TFT system, an electrostatic latent image generated by radiation is held by the charge accumulation capacitors.

A specific structure of the capacitors 210 and TFTs 220 is as shown in FIG. 6. That is, AMA substrate support 230 is an insulator, and a grounding side electrode 210a of the capacitor 210 and a gate electrode 220a of the TFT 220 are formed thereon. A connection side electrode 210b of the capacitor 210, a source electrode 220b of the TFT 220, and a drain electrode 220c thereof are formed thereabove through an insulation film 240. The top surface thereof is covered by an insulation film 250 for protection. The connection side electrode 210b and source electrode 220b are formed at the same time and connected together as a unit. As for the insulation film 240 constituting both the capacitance insulation film of the capacitor 210 and gate insulation film of the TFT 220, for example, a plasma SiN film is used. The AMA substrate 200 is produced through a thin film forming process or a microfabrication process used for producing a liquid crystal display substrate.

Next, bonding of radiation detection section 100 and AMA substrate 200 will be described. An anisotropic film (ACF) including conductive particles therein, such as silver particles, and having conductivity only in the thickness directions is placed between the substrates 100 and 200, and the substrates 100 and 200 are bonded together by heat/compression bonding with the detection electrode 107 and connection side electrode 210b of the capacitor 210 being aligned with each other. This causes the detection electrode 107 and connection electrode 210b to be electrically connected by the intermediate conductor 140, as well as the substrates 100 and 200 are mechanically bonded together.

The AMA substrate 200 further includes a readout drive circuit 260 and a gate drive circuit 270. As shown in FIG. 7, the readout drive circuit 260 is connected to longitudinal (Y) readout wires (readout address wires) 280, each connecting drain electrodes of the TFTs 220 disposed in the same column. The gate drive circuit 270 is connected to horizontal (X) readout wires (gate address wires) 290, each connecting gate electrodes of the TFTs 220 disposed in the same row. Although not shown in the drawing, a preamplifier (charge-voltage converter) is connected to each readout wire 280 in the readout drive circuit 260. As described above, the readout drive circuit 260 and gate drive circuit 270 are connected to the AMA substrate. Alternatively, an AMA substrate that integrates the readout drive circuit 260 and gate drive circuit 270 therein may also be used.

A radiation detection process of the radiation imaging apparatus having the radiation detector 100 and AMA substrate 200 bonded together is described, for example, in Japanese Unexamined Patent Publication No. 11(1999)-287862.

Hereinafter, examples of the recording photoconductive layers constituting the solid state radiation sensor of the present invention will be described.

Examples 1 to 6 and Comparative Example 2

Selenium alloys shown in Table 1 were produced by filling high purity 5N selenium, Na, and a dopant of $Na_2Se$ in a Pyrex® glass tube to vacuum encapsulate at a pressure not greater than 0.1 Pa, and reacting them at 550 degrees Celsius. The selenium alloys with high purity 5N selenium were put into separate stainless crucibles, and deposited Se films having therein a Na film with a film thickness of 1000 μm were formed on amorphous IZO glass substrates under the following conditions of: a crucible temperature of 280 degrees Celsius, a crucible vacuum of 0.0001 Pa, a substrate temperature of 65 degrees Celsius, and a deposition speed of 1 μm/min. Na localized regions having locations and thickness shown in Table 1 below were created by controlling the deposition time of the selenium alloys and high purity 5N selenium. Then, finally an upper electrode of gold is vapor deposited to produce the devices of examples 1 to 6 and comparative example 2 with a total thickness of 100 nm.

Examples 7 to 10 and Comparative Example 1

Selenium alloys shown in Table 1 were produced by filling high purity 5N selenium, Na, and a dopant of $Na_2Se$ in a Pyrex® glass tube to vacuum encapsulate at a pressure not greater than 0.1 Pa, and reacting them at 550 degrees Celsius. The selenium alloys were put into stainless crucibles, and deposited Se films having therein a Na film with a film thickness of 250 μm were formed on amorphous IZO glass substrates under the following conditions of: a crucible temperature of 280 degrees Celsius, a crucible vacuum of 0.0001 Pa, a substrate temperature of 65 degrees Celsius, and a deposition speed of 1 μm/min. Na localized regions having locations and thickness shown in Table 1 below were created by controlling the deposition time of the selenium alloys and high purity 5N selenium. The devices of examples 7 to 10 and comparative example 1 were produced by further providing an upper electrode of gold by vapor deposition with a total thickness of 100 nm.

Example 11

After depositing the example 8, the selenium alloy doped with Na of 2 ppm remaining in the evaporation crucible is removed at the temperature of 380 degrees Celsius for 30 minutes. Then, 5N selenium is filled in the same crucible and the device of example 11 was produced in the same manner.

(Measurement of Electron Lifetime)

Electron lifetime measurements were conducted by the time of flight (TOF) method based on the description, by S. O. Kasap, and J. A. Rowlands, in Journal of Materials Science: Materials in Electronics, II, 179 (2000). Hole lifetime measurements were conducted by reversing the bias voltage.

(Measurement of Charge Collection)

10mR X-ray was irradiated on the deposited Se films, which are the recording photoconductive layers obtained in the examples 1 to 10 and comparative examples 1 and 2, for 0.2 seconds using a Mo tube with a voltage of 30 kV. A pulsating photocurrent generated in the Se films with a voltage being applied thereto was converted to a voltage through a current amplifier and the converted voltage was measured with a digital oscilloscope. The voltage was applied to the Se film such that an electric field of 10V/μm was obtained, and the amount of collected charge was measured by time integrating the current.

(Analysis of Raw Materials Used for the Devices)

Analysis of Na, which is the raw material used, was conducted by the atomic light absorption method. Element densities in the selenium are indicated by the weight fractions to the selenium expressed in ppm. The 5N selenium in the comparative example 1 was below the measuring limit, and Na density was below 0.01 ppm.

(Analysis of Deposited Film of the Devices)

In order to measure Na densities in the deposited films of the devices of comparative examples 1 and 2, and the devices of examples 1 to 10, a glass substrate of 5×5 cm having an amorphous IZO layer and comb electrodes, and a silicon wafer were provided to perform the deposition at the same time. The entire selenium alloy film on the silicon wafer was dissolved by nitric acid, and the amount of selenium contained in the solution was determined by ICP emission spectroscopy, and the amount of Na was determined by graphite type atomic absorption spectroscopy to determine the average Na density to the selenium in the film.

Na densities in the thickness of the films of 20 nm, 1 μm, 100 μm, and 1000 μm from the interface were obtained in the following way. First, deposited Se films were dissolved by a thick nitric acid solution for different lengths of time to obtain the relationship between the amount of selenium contained in the solution and etched film thickness by calculating the film thickness based on the area of the film and the specific gravity of the selenium. Then, based on the analytical curve, times required for etching the films for 20 nm, 1 μm, 100 μm, and 1000 μm from the interface were determined, thereby Na densities in the thickness of the films of 20 nm, 1 μm, 100 μm, and 1000 μm from the interface were obtained. The results are shown in Table 1 below. Here, in order to eliminate the effects of contamination of Na on the surface layer, rinsing was performed two times to remove Na and K not incorporated in the selenium layer. Further, etching of not greater than 0.1 nm, which causes no selenium to be detected by ICP analysis, was performed two times.

If an inorganic or organic layer other than selenium is disposed on the selenium layer, such layer may be peeled off by a distortion stress resulting from the change in volume of the selenium layer after crystallization, or by the difference in expansion rate when cooled, thereby Na density of the selenium layer attached to the substrate or the selenium layer itself may be obtained.

Note that E/G, Comp E/G, RPL, FCL, I/F, and E/L appearing in Table 1 below indicate Example, Comparative Example, Recording Photoconductive Layer, First Conductive Layer, Interface, and Electron Lifetime respectively.

TABLE 1

| | Raw Material | Average Na Density in Film (ppm) | Position of Localized Na Region with the Density Greater than the Average Na Density in the Film | Localized Na Density | Localized Na Density/ Average Na Density | E/L (μs) |
|---|---|---|---|---|---|---|
| E/G1 | 5N Se/ Na 10 ppm + 5N Se | 0.03 | 20 nm thickness to RPL from I/F between FCL and RPL | 0.3 | 10 | 500 |
| E/G2 | 5N Se/ Na 10 ppm + 5N Se | 0.03 | 20 nm thickness to RPL from position 1 μm to RPL from I/F between FCL and RPL | 0.4 | 13 | 600 |
| E/G3 | 5N Se/ Na 10 ppm + 5N Se | 0.03 | 20 nm thickness to RPL from position 100 μm to RPL from I/F between FCL and RPL | 0.3 | 10 | 600 |
| E/G4 | 5N Se/ Na 10 ppm + 5N Se | 0.03 | 20 nm thickness to RPL from position 1000 μm to RPL from I/F between FCL and RPL | 0.3 | 10 | 600 |
| E/G5 | 5N Se/ Na 10 ppm + 5N Se | 0.03 | 20 μm thickness to RPL from I/F between FCL and RPL | 3.0 | 100 | 650 |
| E/G6 | 5N Se/ Na 10 ppm + 5N Se | 0.03 | 20 μm thickness to RPL from I/F between FCL and RPL | 30 | 1000 | 690 |

TABLE 1-continued

| Raw Material | Average Na Density in Film (ppm) | Position of Localized Na Region with the Density Greater than the Average Na Density in the Film | Localized Na Density | Localized Na Density/ Average Na Density | E/L (μs) |
|---|---|---|---|---|---|
| E/G7 | 5N Se/ Na 2 ppm | 0.01 | 20 μm thickness to RPL from I/F between FCL and RPL | 0.7 | 70 | 700 |
| E/G8 | 5N Se/ Na 5 ppm | 0.02 | 20 μm thickness to RPL from I/F between FCL and RPL | 0.9 | 45 | 900 |
| E/G9 | 5N Se/ Na 10 ppm | 0.03 | 20 μm to RPL from I/F between FCL and RPL | 1.1 | 37 | 1100 |
| E/G 10 | 5N Se/ Na 110 ppm | 0.05 | 20 μm thickness to RPL from I/F between FCL and RPL | 3 | 60 | 1500 |
| E/G 11 | 5N Se | 0.01 | 20 μm thickness to RPL from I/F between FCL and RPL | 0.5 | 50 | 740 |
| Comp E/G1 | 5N Se | Below 0.01 | None | Below 0.01 | 0 | 100 |
| Comp E/G2 | 5N Se/ Na 5 ppm + 5N Se | 0.03 | 20 μm thickness to RPL from I/F between FCL and RPL | 0.25 | 8.3 | 400 |

As is clear from Table 1 above, the devices of examples 1 to 10 have electron lifetimes which are five to dozens times longer compared to the comparative example 1, not doped with any alkali metal, and 1.25 to several times longer compared to the comparative example 2, whose ratio of localized alkali metal density to the average alkali metal density is less than 10 times. Although not shown in Table 1, measured amounts of collected charges of the devices of examples 1 to 10 are approximately 1.2 times greater compared to the comparative example 1.

Although not shown in Table 1, the hole lifetimes of the examples and comparative examples were in the range of 5 to 10 μs. That is, the result shows that the devices of the present invention has no adverse effect in the hole mobility compared to the conventional device.

In order to estimate the temporal crystallization of the amorphous selenium of the examples 1 to 10, a square glass substrate, 5 cm on a side, having an amorphous IZO layer and comb electrodes disposed thereon, and a transparent glass substrate were provided, and vapor depositions were performed at the same time. After leaving for 300 hours under the conditions of 40 degrees Celsius with a relative humidity of 20%, the surface thereof was observed by an optical microscope in reflectance mode with a magnification ratio of 1000 to study locally crystallized granular regions, and the number of granular regions in unit area was counted. The locally crystallized regions were observed only in example 6, which amounted to 470/mm$^2$, but no such crystallized region was observed in other examples, examples 1 to 5 and examples 7 to 10. As described above, it may be said that the solid state sensor having a region with a thickness of 5 to 100 nm, and an average alkali metal density of 0.2 to 10 ppm is particularly superior among the solid state radiation sensors of the present invention, since such solid state radiation sensor may provide both improved electron mobility and minimized crystallization due to the doped alkali metal.

Example 11 was produced by depositing a-Se, not doped with any alkali metal, in an evaporation crucible modified by a compound containing an alkali metal. The electron lifetime thereof is a little over seven times longer compared to the comparative example 1, not doped with any alkali metal.

As described above, the solid state radiation sensor of the present invention is a solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals. Here, a predetermined region is provided between the electrodes, and the average alkali metal density in the predetermined region is greater than or equal to 10 times the average density thereof in the area between the electrodes other than the predetermined region. Therefore, the solid state radiation sensor of the present invention is provided with a recording photoconductive layer having a long electron lifetime and superior electron mobility characteristics. Further, the hole mobility characteristics may not be impaired.

What is claimed is:

1. A solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals, wherein the recording photoconductive layer contains an alkali metal; and a predetermined region of the recording photoconductive layer is provided between the electrodes, and the average density of the alkali metal in the predetermined region is greater than or equal to 10 times the average density thereof in the area between the electrodes other than the predetermined region of the recording photoconductive layer.

2. The solid state radiation sensor according to claim 1, wherein the average density of the alkali metal in the predetermined region is greater than or equal to 100 times the average density thereof in the area between the electrodes other than the predetermined region.

3. The solid state radiation sensor according to claim 2, wherein the predetermined region extends not greater than 1000 μm from either of the interfaces of the recording photoconductive layer in the thickness direction within either the recording photoconductive layer or the electrode.

4. The solid state radiation sensor according to claim 3, wherein the predetermined region extends not greater than 20 μm from either of the interfaces of the recording photoconductive layer in the thickness direction within the recording photoconductive layer.

5. The solid state radiation sensor according to claim 2, wherein the thickness of the predetermined region is 5 to 100 nm.

6. The solid state radiation sensor according to claim 2, wherein the average density of the alkali metal in the predetermined region is 0.2 to 10 ppm.

7. The solid state radiation sensor according to claim 2, wherein the recording photoconductive layer is formed of amorphous selenium.

8. The solid state radiation sensor according to claim 1, wherein the predetermined region extends not greater than 1000 μm from either of the interfaces of the recording photoconductive layer in the thickness direction within either the recording photoconductive layer or the electrode.

9. The solid state radiation sensor according to claim 3, wherein the predetermined region extends not greater than 20 μm from either of the interfaces of the recording photoconductive layer in the thickness direction within the recording photoconductive layer.

10. The solid state radiation sensor according to claim 1, wherein the thickness of the predetermined region is 5 to 100 nm.

11. The solid state radiation sensor according to claim 1, wherein the average density of the alkali metal in the predetermined region is 0.2 to 10 ppm.

12. The solid state radiation sensor according to claim 1, wherein the recording photoconductive layer is formed of amorphous selenium.

13. A method for manufacturing the solid state radiation sensor according to claim 12, wherein the recording photoconductive layer is obtained by depositing the amorphous selenium not containing any alkali metal in an evaporator modified by a compound containing an alkali metal.

14. The solid state radiation sensor according to claim 1, wherein:
the recording photoconductive layer is formed of amorphous selenium doped with a predetermined amount of the alkali metal;
the average density of the alkali metal in the recording photoconductive layer is not greater than 10 ppm; and
the electron lifetime of the recording photoconductive layer is greater than or equal to 500 μs.

15. The solid state radiation sensor according to claim 14, wherein the alkali metal is Na.

16. The solid state radiation sensor according to claim 1, wherein the alkali metal is Na.

17. A method for manufacturing a solid state radiation sensor, in which an electrode is disposed on each side of a recording photoconductive layer, and charges generated in the recording photoconductive layer by the irradiation of radiation, with a predetermined bias voltage being applied between the electrodes, are detected as electrical signals, wherein:
the recording photoconductive layer is formed of amorphous selenium doped with a predetermined amount of an alkali metal;
the average density of the alkali metal in the recording photoconductive layer is not greater than 10 ppm; and
the electron lifetime of the recording photoconductive layer is greater than or equal to 500 μs; and
wherein the recording photoconductive layer is obtained by depositing the amorphous selenium not containing any alkali metal in an evaporator modified by a compound containing an alkali metal.

* * * * *